ELECTRIC CIRCUIT HAVING VOLTAGE DIVIDER EFFECTING PRIMING AND GATES EFFECTING SEQUENCE

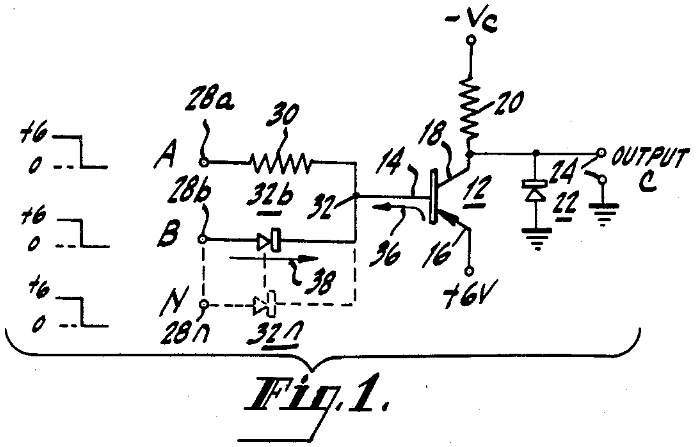
Fig. 1.
| A | B | C |
|---|---|---|
| 0 | 0 | 1 |
| 0 | 1 | 0 |
| 1 | 0 | 0 |
| 1 | 1 | 0 |
Fig. 2.
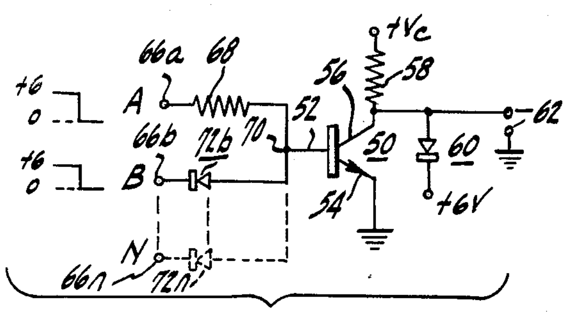
Fig. 3.
| A | B | C |
|---|---|---|
| 0 | 0 | 1 |
| 1 | 0 | 1 |
| 0 | 1 | 1 |
| 1 | 1 | 0 |
Fig. 4.
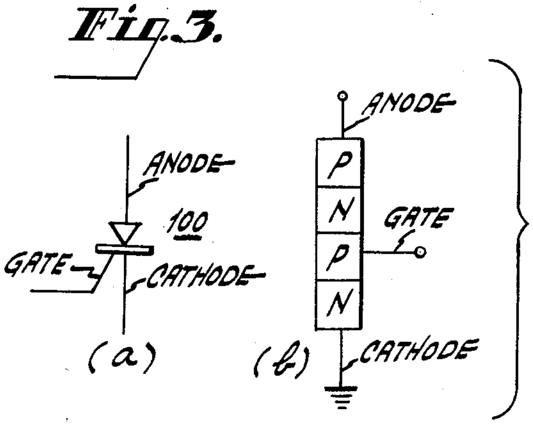
Fig. 6.
INVENTOR.
MORTON SILVERBERG
BY John V. Regan
Attorney INVENTOR.
MORTON SILVERBERG
BY John V. Regan
Attorney 3,147,387

Morton Silverberg, Riverton, N.J., assignor to Radio Corporation of America, a corporation of Delaware Filed May 15, 1961, Ser. No. 109,975
18 Claims. (Cl. 307—88.5)

This invention relates in general to improved transistor gates. The invention also relates to a novel control network which preferably employs these improved gates.

According to one feature of the invention, there are provided improved transistor gate circuits for performing the logical operations of "nor" and "nand." In one type of prior art gate for performing these functions, diodes are used for switching and logic functions, and transistors are used for inversion and amplification. A disadvantage of this type of gate for high speed operation is that a biasing circuit must be connected in common to the output of the diode network and to the input of the transistor for supplying the transistor input current and for holding the collector leakage current to a low value.

Another type of prior art gate employs resistors in the input lines to the transistor. In general, a resistor input gate for performing the described logical operations suffers the disadvantage that the transistor is in the "on," or conducting state, in response to all but one set of input conditions. The transistor input current is not a constant for all "on" conditions, but rather varies in accordance with the number of energized inputs. The degree of transistor saturation and the "turn-off" time of the transistor are affected thereby due to the resulting variation in minority carrier storage.

It is an object of this invention to provide new and improved transistor gate circuits which do not suffer the above and other limitations.

It is another object of the invention to provide improved transistor "nor" and "nand" gates which have the combined advantages of a reduced number of components and controlled transistor input current.

It is yet another object of the invention to provide improved gates of the type described wherein the loading on a selected input is substantially independent of the signal conditions at the other inputs to the gate.

These and other objects of the invention are accomplished by a circuit having a plurality of input terminals and including a transistor connected in the common emitter configuration. A resistor, which preferably has a large value of resistance relative to the input impedance of the transistor, is connected between a first input terminal and a point common to the base electrode. Separate unilateral conducting devices, such as diodes, are connected between each of the other input terminals and the common point. All of the unilateral conducting devices are poled so that the direction of easy current flow between the base electrode and these other input terminals is opposite to the direction of easy current flow between the base electrode and the emitter electrode.

Another feature of the invention is the provision of a novel control network for controlling the phase, or order, of operation of a plurality of devices. In particular, the phase sequence of a multiphase power supply, and apparatus powered therefrom, may be controlled by the network by controlling the order of switching of a plurality of bistable threshold devices, such as silicon controlled rectifiers, thyratrons and the like. The network must be able to withstand the high frequency voltage transients produced by the threshold devices when they switch, preferably without loading down the driving points.

Accordingly, it is another object of the invention to provide an improved control network of the type described.

It is another object of the invention to provide a control network of the type described in which the driving points are not loaded down when any of the threshold devices switches.

Yet another object of the invention is to provide an improved control network of the type described which employs the novel transistor "nor" gates described previously.

A control network according to the invention may comprise a plurality of bistable threshold devices, a like plurality of voltage dividers, and at least a like plurality of two-input gates, one for each threshold device. Each voltage divider is connected between one electrode of a different threshold device and a reference potential. One input of each gate is connected to a point on the voltage divider of an associated threshold device. The voltage at this point has a first value when the threshold device is in the "on" state and a second value when the threshold device is in the "off" state. All of the other gate inputs are connected to a control terminal to which a voltage of said first value may be applied selectively to activate the gate associated with the "on" device. The output electrode of a gate is connected to the control electrode of the one of the devices which it is desired to trigger when that gate is activated. The voltage at the output electrode of the activated gate is insufficient, however, to trigger the device connected thereto, but serves to "prime" the connected device. Control pulses are applied to the control electrodes of all of the threshold devices when it is desired to switch the primed threshold device.

Another feature of the invention is the provision of unidirectional conducting devices connected in series with the gate outputs for blocking the control pulses, and for blocking voltage transients at the threshold device control electrodes, from the output electrodes of the gates.

Still another feature of the invention is the use of the improved transistor "nor" gates described previously.

Another feature of the invention is the provision of a pair of "nor" gates for each threshold device whereby the operation of the threshold devices may be controlled in a first sequence or in a second, opposite sequence.

In the accompanying drawing, like components are designated by like reference characters, and:

FIGURE 1 is a schematic diagram of an improved "nor" gate according to the invention;

FIGURE 2 is a "truth" table for a "nor" gate;

FIGURE 3 is a schematic diagram of an improved "nand" gate according to the invention;

FIGURE 4 is a "truth" table for a "nand" gate;

FIGURE 6*a* is a diagram of a symbol used in FIGURE 5 to represent a controlled rectifier. FIGURE 6*b* is a diagram of a PNPN switch equivalent to the controlled rectifier.

*Description of Gates*

Figure 5:
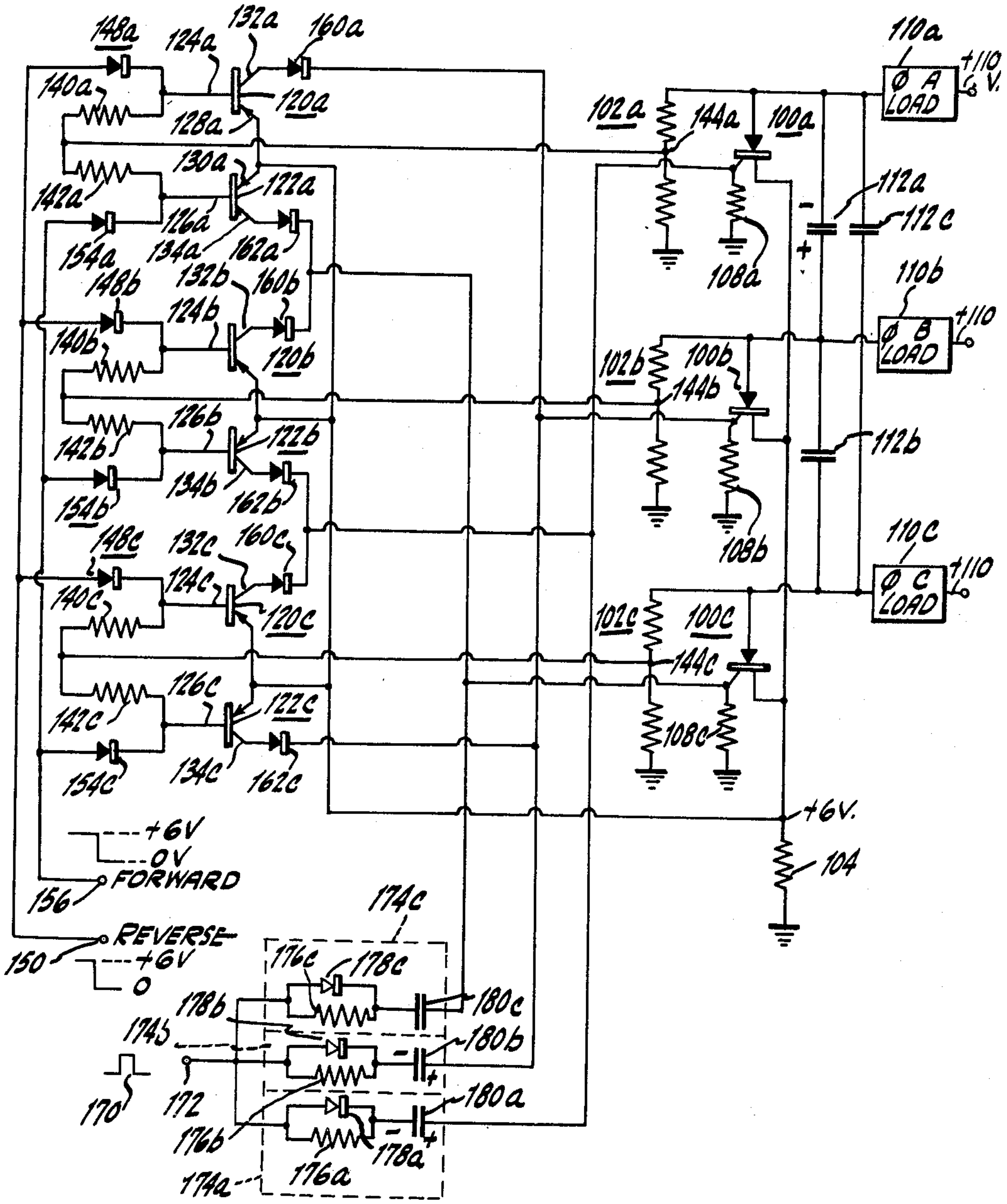
FIGURE 5 is a schematic diagram of the novel control network of the invention.

"Nor" gates and "nand" gates are often used as the basic circuits in an information handling system for performing logical operations. The number of gates used in a digital computer, for example, may vary from a few hundred to several thousand, depending upon the size of the computer. In order to minimize the space required for the circuits, minimize the cost and maximize the reliability of the system, it is important that these gates consist of a minimum number of components. Moreover, it is important in many applications that the current drawn by a gate have a predetermined value, for reasons discussed previously. The novel gates to be described possess the above and other advantageous features.

A "nor" gate according to the present invention is illustrated schematically in FIGURE 1. The gate comprises a PNP transistor 12 having base 14, emitter 16 and collector 18 electrodes. The emitter electrode 16 is connected to a first source of biasing potential, designated +6 v. The collector electrode 18 is connected to a second source of biasing potential, designated $-V_c$ by way of a resistor 20. The voltage $-V_c$ has a value and polarity to bias the collector-base diode in the reverse direction. A diode 22 may be connected between the collector electrode 18 and a source of reference potential, illustrated schematically by the symbol for circuit ground, to clamp the voltage at the collector electrode 18 at the latter reference potential when the transistor 12 is nonconducting. One of a pair of output terminals 24 is connected to the collector electrode 18; the other of the output terminals 24 is connected to reference ground.

Input terminals **28*a*–28*n* are provided for receiving input levels or pulses. A resistor 30 is connected between a first input terminal 28*a* and a junction point 32, which is common to the base electrode 14. Separate unidirectional conducting devices 32*b*–32*n*, illustrated as diodes, are connected between the other input terminals 28*b*–28*n*, respectively, and the junction point 32. These diodes 32*b*–32*n* are poled so that the direction of easy current flow between the base electrode 14 and the input terminals 28*b*–28*n*, respectively, is opposite to the direction of easy current flow in the base 14–emitter 16 path. In FIGURE 1, for example, the direction of easy current flow, in the conventional sense, in the base 14–emitter 16 circuit is indicated by the arrow 36. The direction of easy current flow, in the conventional sense, in the circuit between the base electrode 14 and the input electrode 28*b*, for example, is indicated by the arrow 38. Accordingly, little or no transistor current flows in the diode input circuits. Diode input gates of the prior art employ a separate biasing circuit connected to the base electrode 14 for supplying the transistor 12 current. In the present circuit, the transistor 12 current, as will be described hereinafter, flows in the input circuit which includes the resistor 30**.

A "truth" table for a two-input "nor" gate is given in FIGURE 2, wherein the headings "A" and "B" of the columns in the table correspond to the two inputs applied, for example, at the input terminals **28*a* and 28*b* of FIGURE 1. The heading "C" corresponds to the output derived across the output terminals 24. "0" and "1" correspond to a binary "zero" and a binary "one," respectively. For the example given in FIGURE 1, a binary "1" is represented by a voltage of +6 volts, and a binary "0" is represented by a voltage of zero volts. The output "C" is +6 volts, corresponding to a binary "1," only when the transistor 12 is in full conduction. The output "C" is clamped by diode 22 to zero volts, corresponding to binary "0," whenever the transistor 12 is cut off. The transistor 12 must be in full conduction when, and only when all of the inputs to the gate are at zero volts, and must be substantially cut off whenever one or more of the inputs is at +6 volts, corresponding to a binary "1." Each of the input terminals 28*a*–28*n*** may be connected, for example, to the ungrounded output terminal of a different transistor gate of the type illustrated in FIGURE 1.

Consider the condition where the voltage at the first input terminal **28*a* is at zero volts and the voltage at the input terminal 28*b* is at +6 volts. The diode 32*b* then is forward biased, that is to say, the diode 32*b* is biased for easy current conduction. Current flows from the input terminal 28*b* to the junction point 32 and through the resistor 30 to the input terminal 28*a*. The voltage drop across the diode 32*b* is negligible, for practical purposes, whereby the voltage at the junction 32 is clamped at +6 volts. The transistor 12 does not conduct because the emitter 16–base 14 diode is not sufficiently forward biased, and the output voltage across the terminals 24** is zero volts.

Consider now the case where the voltage at the first input terminal **28*a* is +6 volts and the voltage at any of the other input terminals is zero volts. No current flows through any of the diodes 32*b*–32*n* when the voltage at the corresponding input terminal is zero volts. Accordingly, no current flows through the resistor 30 and the voltage at the junction point 32** is +6 volts. The same condition exists when all of the input voltages are +6 volts.

Consider now the condition where all the inputs are at zero volts. The voltage at the junction point 32 and the base electrode 14 drops toward zero volts. The base 14–emitter 16 diode of the transistor 12 then becomes forward biased and the transistor 12 conducts. Current flows out of the base electrode 14 in the direction indicated by the arrow 36. This current flows through the resistor 30 to the input terminal **28*a*, whereby the base 14 voltage rises in a positive direction. None of the base current flows through the then back-biased diodes 32*b*–32*n*. The resistor 30 preferably has a value which is much greater than the resistance seen looking into the base electrode 14, and which is much larger than the forward resistances of the input diodes 32*b*–32*n*. The load presented by the circuit to the input terminal 28*a* then is constant when the voltage at the input terminal 28*a* is zero volts, regardless of the input conditions at the remaining input terminals 28*b*–28*n***.

It is thus seen that the operation of the "nor" gate of FIGURE 1 satisfies the "truth" table of FIGURE 2. It should be noted that the transistor 12 conducts in response to only one given set of input conditions, whereby the transistor 12 current is constant in the "on" condition, and that no base 14 biasing circuit is required.

A "nand" gate according to the invention is illustrated schematically in FIGURE 3. This gate comprises an NPN transistor 50 having base 52, emitter 54 and collector 56 electrodes. The emitter electrode 54 is directly connected to reference ground. The collector electrode 56 is connected by a resistor 58 to a source of biasing potential designated $+V_c$. A diode 60 is connected between the collector electrode 56 and a source of voltage of +6 volts. The diode 60 effectively clamps the voltage at the collector electrode 56 at +6 volts when the transistor 50 is non-conducting. One of a pair of output terminals 62 is connected to the collector electrode 56; the other one of the output terminals 62 is connected to circuit ground.

A plurality of input terminals **66*a*–66*n* is provided for receiving input pulses or levels of either +6 volts or zero volts. A resistor 68 is connected between the input terminal 66*a* and a junction point 70, which is common to the base electrode 52. Separate diodes 72*b*–72*n* are connected between each of the other input terminals 66*b*–66*n*, respectively, and the junction point 70. The diodes 72*b*–72*n* are poled so that the direction of easy current flow between the base electrode 52 and any of the input terminals 66*b*–66*n* is opposite to the direction of easy current flow between the base electrode 52 and the emitter electrode 54**.

A "truth" table for a two-input "nand" gate is give in FIGURE 4, wherein the headings "A," "B" and "C" and the "0" and "1" have the significance described previously. As seen from the "truth" table, the output of a "nand" gate is a binary "0" only when all of the inputs thereto are binary "1's," and is a binary "1" whenever one or more of the inputs is a binary "0." This means that the transistor 50 must conduct only when all of the inputs applied at the input terminals **66*a*–66*n*** are at +6 volts, and must be substantially nonconducting for any other set of input conditions.

Consider the condition where an input of +6 volts is applied at the first input terminal **66*a*, and an input of zero volts is applied at the input terminal 66*b*. The diode 72*b* then is forward biased and presents a low impedance to current flowing from the input terminal 66*a* to the input terminal 66*b*. The voltage at the junction point 70 is essentially clamped at zero volts by the diode 72*b*, whereby the transistor 50** does not conduct. The output across the terminals 62 is +6 volts, corresponding to a binary "1."

Consider now the condition where the input at the first input terminal 66a is zero volts and the input at the input terminal 66b is +6 volts. The diode 72b then is back-biased and little or no current flows therethrough. The same condition exists when all of the inputs are at zero volts. The voltage at the junction point 70 also is zero volts, whereby the transistor 50 does not conduct.

Consider now the condition where the inputs at all of the input terminals 66a–66n are +6 volts. The voltage at the junction point 70 rises in a positive direction and gates the transistor 50 "on." Current in the conventional sense, flows into the base 52 from the junction point 70. This current comes from the source connected at the input electrode 66a and flows through the resistor 68, lowering the voltage at the junction point below +6 volts. None of the current flows through the diodes 72b–72n. The voltage at the collector electrode 56 falls close to zero volts when the transistor 50 is driven into saturation. The voltage across the output terminals 62 is substantially zero, corresponding to a binary "0."

It is thus seen that the logic performed by the "nand" gate of FIGURE 3 corresponds to that given in the "truth" table of FIGURE 4. It should be noted that the current through the transistor 50 is constant in the conducting condition because the transistor 50 conducts only in response to a single set of input conditions. Again, no base 52 biasing circuit is required. The load presented to the input terminal 66a may be maintained substantially constant, when the voltage thereat is +6 volts, regardless of the input conditions at the other input terminals 66b–66n, by making the resistance of the resistor 68 much larger than the resistance measurable from the junction point 70 to ground.

*Control Network*

A control network for controlling the phase or sequence of operation of a plurality of devices is illustrated in FIGURE 5. Three devices to be controlled, indicated by the reference characters 100a, 100b and 100c are shown by way of illustration. Each of these devices preferably is a bistable threshold device such as a silicon controlled rectifier, PNPN switch, thyratron, or the like. The symbol used to represent the threshold devices is one commonly used in the art for a silicon controlled rectifier. This symbol is illustrated with labels in FIGURE 6a. The silicon controlled rectifier is a high power, bistable, controlled switching device analogous to a thyratron or ignitron and which has high speed switching characteristics. The device has an anode (indicated by the arrowhead), a cathode (indicated by the lead opposed to, and aligned with, the arrowhead extending from the line transverse to the arrowhead and the cathode line) and a gate electrode (indicated by the line inclined to the transverse line). The device is bistable and may be triggered to the stable "on" condition by raising the voltage at the gate electrode above the voltage at the cathode. The impedance between the anode and cathode is very low when the device is in the "on" state. A device of this type generally is switched from the "on" to the "off state by applying a negative voltage, relative to the cathode voltage, to the anode.

The silicon controlled rectifier is equivalent for the present purposes to a PNPN switch, the generally recognized symbol for which is illustrated in FIGURE 6b. Such devices are described in "Electronics, volume 31 March 28, 1958, at pages 52–55, "Semiconductor Products," April 1961, at pages 42–45, and in other publications.

A separate voltage divider 102a, 102b, 102c is connected between one of the electrodes, for example the anode or output electrode, of each of the threshold devices 100a–100c, respectively, and circuit ground. The cathodes, or input electrodes, of all of the devices are connected together and to one end of a resistor 104, the other end of which is connected to ground. Separate resistors 108a–108c are connected between the gate or control electrodes of the devices 100a–100c, respectively, and ground. The output electrode of each device, for example the device 100a, may be connected through an output load 110a to a source of high voltage, for example a voltage of 110 volts. Energy storage devices 112a, 112b, 112c, illustrated as capacitors, are connected between the output electrodes of the various pairs of devices 100a, 100b, and 100c, for purpposes which will be described hereinafter.

Three pairs of transistor "nor" gates, one pair for each of the threshold devices, are provided for controlling the sequence of operation of the threshold devices 100a–100c and, consequently, the energization of the loads 110a–110c, respectively. The "nor" gates preferably are of the type illustrated in FIGURE 1 and described hereinabove. A description of one pair of gates will suffice inasmuch as all of the pairs are similar, except as noted hereinafter. The top pair comprises two PNP transistors 120a, 122a having base electrodes 124a, 126a respectively, emitter electrodes 128a, 130a, respectively and collector electrodes 132a, 134a, respectively. The emitter electrodes 128a, 130a of these and all other transistors are connected together and to the ungrounded end of the resistor 104. The base electrode 124a and 126a are connected by way of input resistors 140a, 142a, respectively to a point 144a on the voltage divider 102a of the associated threshold device 100a. The voltage at this point 144a represents a first input to each of the first pair of gates. The base electrode 124a of the transistor 120a is connected by a diode 148a to a first control input terminal 150. The base electrodes 124b, 124c of the first transistors 120b and 120c of the other pairs are similarly connected by way of diodes 124b, 124c, respectively, to the first control input terminal 150. The base electrode 126a of the transistor 122a is connected by a diode 154a to a second control input terminal 156. The base electrodes 126b and 126c of the transistors 122b and 122c are similarly connected through diodes 154b and 154c to the second control input terminal 156.

Each of the collector electrodes of a pair of gates is connected through a diode to the gate electrode of a different, nonassociated one of the threshold devices 100a–100c. For example, the collector electrodes 132a and 134c of the transistors 120a and 122c are connected by way of diodes 160a and 162c to the gate electrode of the threshold device 100b. The collector electrodes 134a and 132b of the transistors 122a and 120b are connected to the gate electrode of the threshold device 100c by way of diodes 162a and 160b. The collector electrodes 134b and 132c of the transistors 122b and 120c are connected to the gate electrode of the threshold device 100a by way of diodes 162b and 160c. Although separate diodes are illustrated for each transistor collector circuit, it will be apparent that a single diode may be connected between each gate electrode of a threshold device and the pair of collector electrodes connected thereto. For example, the collector electrodes 132a and 134c of the transistor 120a and 122c may be connected together, and a single diode (not shown) may be connected between the pair of collectors 132a and 134c and the gate electrode of the threshold device 100b in place of the diodes 160a and 162c. These diodes isolate the associated transistors from voltage transients developed at the gate electrodes of the threshold devices 100a–100c when any of these devices is switched from the "off" to the "on" state.

Pulses 170 for switching the threshold devices 100a–100c are applied at an input terminal 172. The input terminal 172 is connected by separate networks 174a–174c to each of the gate electrodes of the devices 100a–100c, respectively. The network 174a, for example, comprises the parallel combination of a resistor 176a and a diode 178a having one end connected to the input terminal 172 and the other end connected to one end of a capacitor 180*a*. The other end of the capacitor 180*a* is connected directly to the gate electrode of the threshold device 100*a*.

The diodes 160*a*, 160*b*, 160*c* and 162*a*, 162*b*, 162*c* in the collector circuits of the transistors 120*a*, 120*b*, 120*c* and 122*a*, 122*b*, 122*c*, respectively serve the additional function of preventing the "on" transistor from shorting out the input pulses 170. The diodes 178*a*, 178*b*, 178*c* in the pulse input networks are poled to present a low impedance to the input pulses 170.

The sequence of switching of the devices 100*a*–100*c* in response to the input pulses 170 is determined by the voltages applied at the first and second control input terminals 150 and 156, as will be described more fully hereinafter. The control network is particularly well suited for controlling the rotation, and direction of rotation, of a three-phase digital stepping motor of the type described in applicant's copending application for "Position Control Apparatus," Serial No. 110,126, filed concurrently herewith, and assigned to the assignee of the present invention. The control network of FIGURE 5 may be, for example, the motor control 112, illustrated in FIGURE 4 of said copending application, in which case the voltages applied at the first and second control input terminals 150, 156 are the "reverse" and "forward" outputs of the forward-reverse flip-flop 222, illustrated in FIGURE 6*c* of said copending application. The control pulses 170 may be the output of the seventh one-shot 206, illustrated in FIGURE 6*b* of said copending application. When the control network is used for this purpose, the output loads 110*a*–110*c* are the three phase windings of the bidirectional digital stepping motor aforementioned, and the direction of rotation of the motor is controlled by controlling the sequence of switching of the threshold devices 100*a*–100*c*.

Consider now the operation of the control network and assume that the loads 110*a*, 110*b* and 110*c* are the $\phi_A$, $\phi_B$ and $\phi_C$ windings of a three phase bidirectional, digital stepping motor. The motor may be considered to rotate in a forward or clockwise direction in response to input pulses 170 when the $\phi_A$, $\phi_B$ and $\phi_C$ windings are sequentially energized in that order. On the other hand, the motor rotates in the reverse or counterclockwise direction when the windings are energized in another order, for example $\phi_A$, $\phi_C$, $\phi_B$. The direction of rotation is determined by the voltages applied at the first and second control input terminals 150 and 156, respectively. These voltages always are of the opposite sense to one another. That is to say, the voltage at the terminal 150 is +6 volts when the voltage at the other terminal 156 is zero volts, and vice versa. The motor rotates in a clockwise direction in response to input pulses 170 when the voltage at the second control terminal 156 is +6 volts, and rotates in the counterclockwise direction when the voltage at the first control input terminal 150 is +6 volts.

Only one of the threshold devices 100*a*–100*c* is in the "on" state at a time. The impedance between the output electrode, or anode, and the input electrode, or cathode, of the "on" threshold device is very low and the potential difference thereacross is negligible for practical purposes. Current flows from the +110 volt source, through the load, the "on" device and the common cathode resistor 104. The value of the resistor 104 is selected so that the voltage at the ungrounded end thereof is approximately +6 volts in the present example. Accordingly, all of the emitter electrodes of the transistor 120 and 122 are held at +6 volts.

The impedance of a threshold device is very high when the device is in the "off" state. Little or no current then flows through the device. The resistors in the voltage dividers 102*a*–102*c* are selected so that very little current flows through the phase winding of an "off" threshold device. The resistors are proportioned to provide a voltage of approximately +6 volts at the divider tap, point 144*a* for example, when the associated threshold device, 100*a* for example, is in the "off" state. The voltage at a divider tap then is one-half volt or less when the associated threshold device is in the "on" state, and may be considered to be zero volts. The voltage at a divider tap serves as one input to each of the transistors in the associated pair of gates. A voltage of +6 volts at the divider tap prevents the associated transistors from conducting because the voltage at the emitter electrodes is +6 volts. On the other hand, a voltage of zero volts at the divider tap enables one input of each of the associated transistors. The other input of one only of this transistor pair is enabled by the control voltage at one of the first and second control input terminals 150 and 156.

By way of illustration, assume that the threshold device 100*a* is "on," the voltage at the first control input terminal 150 is zero volts, and the voltage at the second control input terminal 156 is +6 volts. The votlage at the divider tap 144*a* is approximately zero volts and the voltage at each of the other taps 144*b*, 144*c* are +6 volts, for reasons described previously. The transistor 120*a* conducts because both of the inputs thereto are at zero volts. Current flows in the path from ground, through the common cathode resistor 104, the transistor 120*a*, diode 160*a* and back to ground through the resistor 108*b* in the gate circuit of the threshold device 100*b*. The voltage at the gate electrode of the threshold device 100*b* is approximately +6 volts by virtue of the current flow through the resistor 108*b*. This voltage is not of itself great enough to switch the device 100*b*, but serves to "prime" the input. The voltage at the gate electrode of the "on" threshold device 100*a* also is close to +6 volts since the gate voltage of an "on" device is approximately the same as the voltage at the cathode thereof. The voltage at the gate electrode of the other threshold device 100*c*, however, is approximately zero volts.

The capacitor 112*a* connected between the output electrodes of the threshold devices 100*a* and 100*b* is charged to approximately 100 volts in the polarity direction indicated. The capacitors 180*a* and 180*b* in the input networks 174*a* and 174*b* are charged to approximately +6 volts in the polarity indicated. The operating conditions described above continue until an input pulse 170 is applied at the control terminal 172. This pulse is passed by the diode 178*b* and the capacitor 180*b* to the "primed" gate electrode of the threshold device 100*b* and raises the gate voltage above the switching or threshold potential. The voltage at the anode of the device 100*b* then drops to a low value, and the voltage coupled by the capacitor 112*a* to the anode of the device 100*a* switches the latter device 100*a* to the "off" state. A large current, relatively speaking, flows through the $\phi_B$ winding 110*b* when the device 100*b* is turned "on." The diodes 160*a* and 162*c* block the voltage transient at the gate electrode of the device 100*b* from the transistors 120*a* and 122*c*. All of the diodes 160*a*–160*c* and 162*a*–162*c* serve to block the input pulses 170 from reaching the transistors.

The voltage at the divider tap 144*b* now is close to zero volts and the voltages at the other taps 144*a* and 144*c* are +6 volts. Accordingly, the transistor 120*b* conducts and raises the voltage at the gate electrode of the threshold device 100*c* to +6 volts, thus priming the input to the latter device. The next input pulse 170 switches the threshold device 100*c* to the "on" state, and the drop in voltage at the anode thereof is coupled to the anode of the threshold device 100*b* by the capacitor 112*b*, thereby turning off the latter device 112*b*.

The phase sequence is reversed by reversing the control inputs applied at the first and second control input terminals 150 and 156. Assume that the threshold device 100*a* is "on" and that an input of +6 volts is applied to the second control input terminal 156, as in the above example. The transistor 120*a* conducts and the capacitor 180*b* in the input network 174*b* is charged, as indicated.

Assume that the voltages at the first and second control input terminals 150 and 156 are reversed suddenly to reverse the switching sequence.

The transistor 122a turns on and the transistor 120a turns off in response to the aforementioned voltage reversal, and the voltage at the gate electrode of the threshold device 100c rises to +6 volts. This voltage rise tends to be coupled through the networks 174c and 174b to switch the threshold device 100b to the "on" state. The diode 178c, however, presents a high impedance to this voltage rise. The resistors 176a, 176b, 176c are are chosen in value to prevent the sneak triggering aforementioned. These resistors 176a, 176b and 176c also serve to provide discharge paths for the associated capacitors 180a, 180b, 180c, respectively.

The next input pulse 170 is coupled by the network 174c to the gate electrode of the primed threshold device 100c, and triggers this device 100c to the "on" state. The drop in voltage at the anode thereof is coupled by the capacitor 112c to the anode of the previously "on" device 100a, turning the latter device 100a off. The transistor 122c then conducts and raises the voltage at the gate electrode of the threshold device 100b to +6 volts. The next input pulse 170 switches the threshold device 100b to the "on"state.

In summary, the control network illustrated in FIGURE 6 controls the sequence of operation of a plurality of threshold devices 100a–100c in response to applied input pulses 170. The threshold devices 100a–100c, in turn, may control a three phase power supply, for example, to control a three phase motor or other apparatus. The sequence of operation may be controlled in a forward direction or a reverse direction by controlling the voltages applied at the control terminals 150, 156. Although only three threshold devices 100a–100c and associated gates are illustrated, it will be understood that additional devices also may be added and controlled. It will also be understood that one of the control input terminals 150 or 156 and the associated transistors 160a–160c or 162a–162c may be omitted if control of the sequence in only one direction is desired or required.

Various modifications may be made in the FIGURE 5 control network without departing from the spirit of the invention. The voltage dividers 102a–102c, for example, need not be connected between the output electrode of associated threshold devices 100a–100c, respectively, and circuit ground. It is only necessary that the voltage at a divider tap be approximately +6 volts or zero volts when the associated device is in one stable state and the other stable state, respectively. Also, the common cathode resistor 104 may be replaced by separate +6 volt sources in each of the threshold device cathode circuits and transistor emitter circuits.

What is claimed is:

1. In a sequence control network including a plurality of bistable threshold devices each having a control electrode, an output electrode and an input electrode, means for applying a potential difference between each said output electrode and the corresponding said input electrode, and a like plurality of voltage dividers each connected between an output electrode of a different one of said devices and a common reference potential, the combination of: a plurality of transistors, one for each bistable device, each having an emitter electrode connected to a point of substantially constant potential, a base electrode and a collector electrode; a like plurality of resistance elements each connecting a different said base electrode to a point on the associated one of said voltage dividers; separate unidirectional conducting means each connected between a different said base electrode and a common point and poled so that the direction of easy current flow between a said base electrode and said common point is opposite to the direction of easy current flow between that base electrode and the corresponding said emitter electrode; and means connecting each different collector electrode to the said control electrode of a different, non-associated one of said bistable devices.

2. A sequence control network comprising, in combination: a plurality of threshold devices each having at least a control electrode, an output electrode, and an input electrode; means for applying a potential difference between each said output electrode and the corresponding said input electrode; a like plurality of voltage dividers each connected between the output electrode of a different one of said devices and a common reference potential; a like plurality of two-input gates each having a control electrode common to the two inputs, an output electrode, and an input electrode connected to a point of substantially constant potential; means connecting each said gate output electrode to a different said threshold device control electrode; means connecting one of said two inputs of each of said gates to a common point; and means connecting each of the others of said two inputs to a point on a different one of said voltage divider.

3. A sequence control network comprising, in combination: a plurality of bistable threshold devices each having an output electrode and an input electrode defining a current path, and a control electrode; means for applying a potential difference between each said output electrode and the corresponding said input electrode; a like plurality of voltage dividers each connected between the output electrode of a different one of said threshold devices and a common reference potential; a like plurality of two-input gates each having at least a control electrode common to the two inputs and an output electrode; means connecting each said gate output electrode to a different said threshold device control electrode; means connecting one of the two inputs of each of said gates to a common point; means connecting each of the others of said two inputs to a tap on a different one of said voltage dividers; and means for intermittently applying input signals simultaneously to each said threshold device control electrode.

4. The sequence control network claimed in claim 3 wherein any of said gates is activated only when the voltage at both inputs thereto is of a given polarity and exceeds a certain value, and wherein the voltage at a said voltage divider tap has said given polarity and exceeds said certain value only when the associated one of said threshold devices is in the "on" state.

5. The sequence control network claimed in claim 4 including means for applying to said common point a voltage which has said given polarity and which exceeds said certain value.

6. The sequence control network claimed in claim 3 including a like plurality of energy storage devices each having one end connected to a different said threshold device output electrode and the other end connected to one of said output electrode, said control electrode and said input electrode of still a different one of said threshold devices.

7. The sequence control network claimed in claim 3 wherein each said gate output electrode is connected to a different said threshold device control electrode by way of a unidirectional conducting device.

8. In a control network including N bistable threshold devices each having an output electrode, an input electrode and a control electrode, means for applying a potential difference between each said output electrode and the corresponding said input electrode, N voltage dividers each connected between the output electrode of a different one of said devices and a point of reference potential, the combination comprising: N pairs of first and second transistors, one pair for each of said bistable devices, each having a collector electrode, an emitter electrode connected to a point of substantially fixed potential, and a base electrode; separate resistor elements connecting each said base electrode of the Kth pair of said transistors to each other and to a tap on the voltage divider associated with the Kth one of said bistable devices, where K is any integer from one to N; a first control input terminal and a second control input terminal; a first set of N unidirectional conducting means each connected between said first input terminal and the base electrode of a different one of said first transistors; a second set of N unidirectional conducting means each connected between said second input terminal and the base electrode of a different one of said second transistors, said first and second sets of unidirectional conducting means being poled so that the direction of easy current flow between each said base electrode and the corresponding one of said first and second input terminals is opposite to the direction of easy current flow between that base electrode and the emitter electrode of the same transistor; means connecting said collector electrode of the first transistor of the Kth pair to said control electrode of the (K+1)th one of said bistable devices; and means connecting said collector electrode of the second transistor of the Kth pair of transistors to said control electrode of the (K−1)th one of said bistable devices.

9. A sequence control network comprising, in combination: N bistable threshold devices each having an input electrode and an output electrode defining a current path, and a control electrode; means for applying a potential difference between each said output electrode and the associated said input electrode; N voltage dividers each being connected from the output electrode of a different one of said devices to a common reference potential; N pairs of first and second two-input gates each having an output electrode; a first control input terminal common to a first input of each of said first gates; a second control input terminal common to a first input of each of said second gates; means connecting both of the second inputs of the Kth pair of gates to each other and to a point on the voltage divider associated with the Kth one of said threshold devices, where K is any integer from one to N; means connecting said output electrode of the first gate of said Kth pair to said control electrode of the (K+1)th one of said threshold devices; and means connecting the output electrode of the second gate of said Kth pair to said control electrode of the (K−1)th one of said threshold devices.

10. The control network claimed in claim 9 including means for selectively varying the voltage at said first control input terminal between a first value and a second value and for simultaneously varying the voltage at said second control input terminal between said second value and said first value.

11. The control network claimed in claim 10 wherein the voltages at the control electrodes of said threshold devices due to the outputs of said gates are of insufficient amplitude to switch said threshold devices, and including means for applying input pulses to the control electrodes of said threshold devices.

12. The control network claimed in claim 10 wherein the voltage at said point on a said voltage divider of a triggered threshold device has a magnitude to enable both of said second inputs of the associated pair of said gates, and wherein the voltage applied to one of said first control input terminal and said second control input terminals, but not the other, has a value to enable the gate inputs connected thereto.

13. The control network claimed in claim 10 wherein each of the means connecting a said gate output electrode to a said threshold device control electrode includes a unidirectional conducting device.

14. The control network claimed in claim 10 including a separate output load connected to each said threshold device output electrode.

15. The control network claimed in claim 14 wherein N=3, and wherein each said output load is a different phase winding of a bidirectional digital stepping motor.

16. The control network claimed in claim 10 including N energy storage devices, and means connecting the Kth one of said energy storage devices between the output electrodes of the Kth and (K+1)th threshold devices.

17. The control network claimed in claim 10 including an impedance element having one end connected to said common reference potential and having the other end connected in common to the input electrodes of all of said threshold devices.

18. The combination comprising: a plurality of threshold devices each having a control electrode, an output electrode, and an input electrode; means for applying operating potential between each said output electrode and the corresponding said input electrode; a like plurality of voltage dividers each being connected between the output electrode of a different one of said threshold devices and a point of reference potential; a like plurality of gates each having two inputs and one output; means connecting the output of each different gate to the control electrode of a different one of said threshold devices; means connecting one input of each gate to a common point; and means connecting a point on each different voltage divider to the other input of a different one of the gates.

References Cited in the file of this patent

UNITED STATES PATENTS

| | | |
|---|---|---|
| 2,939,064 | Momberg et al. | May 31, 1960 |
| 2,953,735 | Schmidt | Sept. 20, 1960 |
| 2,995,696 | Stratton et al. | Aug. 8, 1961 |
| 3,032,664 | Rowe | May 1, 1962 |
| 3,073,970 | Bright | Jan. 15, 1963 |
| 3,091,729 | Schmidt | May 28, 1963 |